United States Patent
Choi

(10) Patent No.: US 7,663,958 B2
(45) Date of Patent: Feb. 16, 2010

(54) SEMICONDUCTOR DEVICE

(75) Inventor: Young Kyoung Choi, Kyeonggi-do (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 250 days.

(21) Appl. No.: 11/773,779

(22) Filed: Jul. 5, 2007

(65) Prior Publication Data

US 2008/0117706 A1    May 22, 2008

(30) Foreign Application Priority Data

Nov. 16, 2006    (KR) ...................... 10-2006-0113189

(51) Int. Cl.
*G11C 5/14* (2006.01)
(52) U.S. Cl. .................. 365/226; 365/230.03
(58) Field of Classification Search ................. 365/226, 365/230.03, 230.08, 236, 203, 189.11
See application file for complete search history.

(56) References Cited

U.S. PATENT DOCUMENTS

| | | | | |
|---|---|---|---|---|
| 6,172,931 B1 * | 1/2001 | Cha et al. | .................... | 365/226 |
| 6,496,438 B2 * | 12/2002 | Saito | ........................... | 365/226 |
| 2007/0153612 A1 * | 7/2007 | Lee et al. | ..................... | 365/226 |

FOREIGN PATENT DOCUMENTS

| | | |
|---|---|---|
| KR | 1020000008363 | 2/2000 |
| KR | 1020050073969 | 7/2005 |

OTHER PUBLICATIONS

Korean Notice of Allowance for Korean application No. 10-2006-0113189.

* cited by examiner

*Primary Examiner*—Pho M Luu
*Assistant Examiner*—Toan Le
(74) *Attorney, Agent, or Firm*—Lowe Hauptman Ham & Berner, LLP

(57) ABSTRACT

A semiconductor device reduces a number of boost voltage pumps by controlling an operation of the boost voltage pumps in accordance with the number of activated memory banks, thereby reducing an area which the boost voltage pumps occupy in a memory. The semiconductor device includes memory banks, a boost voltage generating controller, and boost voltage pumps. The boost voltage generating controller outputs boost voltage enable signals corresponding to the number of activated memory banks of the memory banks, wherein the number of the boost voltage enable signals is smaller than that of the memory banks. The boost voltage pumps generate a boost voltage in response to the boost voltage enable signal, and provide the boost voltage to the activated memory bank. Here, the number of the boost voltage pumps is less than that of the memory banks.

17 Claims, 7 Drawing Sheets

SEMICONDUCTOR DEVICE

CROSS-REFERENCE TO RELATED APPLICATIONS

This application claims priority from Korean Patent Application No. 2006-113189, filed on Nov. 16, 2006, the contents of which are incorporated herein by reference in its entirety.

BACKGROUND OF THE INVENTION

The present invention relates to a semiconductor device. More particularly, the present invention relates to an apparatus for generating a boosting voltage Vpp in a semiconductor device.

Most of semiconductor devices have an internal voltage generator for generating an internal voltage using a power supply voltage Vdd supplied from an outside apparatus in its chip, and supply by itself a voltage needed for operating circuits included in the chip by using the internal voltage generator. A main issue in using the internal voltage generator is to supply stably the internal voltage having a desired level.

However, the power supply voltage Vdd has been rapidly lowered as a scaling-down of critical dimension of an integrated circuit included in a present semiconductor device is continuously progressed. Accordingly, a lay-out technique for satisfying a performance required in a low voltage environment has been required.

In the low voltage environment, most of semiconductor devices use the boosting voltage Vpp having a level higher than the power supply voltage Vdd by a certain level to compensate a voltage loss generated when the semiconductor devices operate using the power supply voltage Vdd and maintain normal data.

The boosting voltage Vpp is frequently employed as a gate voltage of an N-MOS transistor when a core voltage, etc having high level is applied through the N-MOS transistor. Here, the core voltage, etc means a voltage having a level higher than the power supply voltage Vdd of voltages employed in for example, a DRAM.

In addition, since the boosting voltage Vpp is used as a back bias voltage of a P-MOS transistor included in a sense amplifier, the boosting voltage Vpp affects to an operation of the sense amplifier. Accordingly, it is important to maintain stable the boosting voltage Vpp while DRAM is being operated.

FIG. 1A is a view illustrating a control circuit of a common boosting voltage generator. FIG. 1B is a timing diagram illustrating signals used in the control circuit in FIG. 1A. Here, a ractvbp<n> indicates a low pulse generated when nth memory bank is activated, a rpcgbp<n> means a low pulse generated when the nth memory bank is precharged. Additionally, a power up signal pwrup for initializing maintains a low level when a power is turned on, and is converted into high level when the power is stabilized.

According to FIG. 1A, the control circuit of the boosting voltage generator includes P-MOS transistors 10 and 40, an N-MOS transistor 20, a latch circuit 50, inverters 30 and 60, a delay circuit 70 and an NAND gate 80.

According to FIG. 1B, when power is turned on, the P-MOS transistor 40 is instantaneously turned on by the power up signal pwrup. As a result, an output of the latch circuit 50 is reset to low state, i.e. the latch circuit 50 is initialized.

Subsequently, a bank selecting signal ractvbp<n> is generated when a nth memory bank is activated and is converted from high state into low state, and hence an output of the inverter 30 has high level. As a result, the N-MOS transistor 20 is turned on. Hence, a voltage of a node N1 is changed from high state to low state, and so the output of the latch circuit 50 has high state. Accordingly, an output ractb<n> of the inverter 60 has low state, and so an output of the NAND gate 80, i.e. boost voltage pump driving signal vpp_act<n> maintains high state.

Further, a precharge command signal rpcgbp<n> is generated when the nth memory bank is precharged and converted from high state into low state and the P-MOS transistor 10 is turned on. Hence, the voltage of the node N1 is changed from low state into high state, and so the output of the latch circuit 50 has low state. Accordingly, the output ractb<n> of the inverter has high state. That is, the output ractb<n> of the inverter 60 is changed from low state into high state. However, the output of the NAND gate 80 maintains high state during a delay time by the delay circuit 70.

In short, the boost voltage pump driving signal vpp_act maintains high state during the delay time by the delay circuit 70 though the precharge command signal rpcgbp<n> is converted from high state into low state. Hence, a boost voltage pump operates stably.

For the convenience of understanding, it is considered that amount of a boost voltage generated from one boost voltage pump is identical to that of a boost voltage needed for one memory bank for the convenience of description.

In this case, boost voltage pumps correspond one-to-one with memory banks. Hence, when the memory bank is activated, the boost voltage Vpp is uniformly applied to each of the memory banks included in a DRAM.

In case where certain memory bank is activated, a boost voltage pump corresponding to the memory bank is driven. Accordingly, a number of the boost voltage pumps are identical to that of the memory banks.

However, when the number of the memory banks included in the DRAM is great, a number of memory banks activated at a time is limited. For example, in case that 8 memory banks are included in the DRAM, the number of the memory banks may be limited to maximum four.

In this case, though 8 boost voltage pumps corresponding to 8 memory banks are included in the DRAM, only 4 memory banks of the 8 memory banks are activated at a time. In other words, only a half of the boost voltage pumps are operated.

Nevertheless, since each of the memory banks has one boost voltage pump, respectively, the boost voltage pumps are wasted. In addition, the area in Dram corresponding to the boost voltage pumps that are not activated is unnecessarily used.

Specially, since the boost voltage Vpp is higher than the power supply voltage Vdd, a size of the boost voltage pump where a MOS transistor is used as a capacitor is increased. Accordingly, the area which the boost voltage pumps occupy in the DRAM is more augmented.

In other words, the number of the boost voltage pumps effects an area which the control circuit occupies in the DRAM. Accordingly, the constitution of the above boost voltage generator causes increase in the area which the control circuit occupies in the DRAM.

SUMMARY OF THE INVENTION

It is an object of the present invention to provide a semiconductor device for reducing the number of boost voltage pumps that are wasted by controlling the number of the boost voltage pumps activated in accordance with a number of activated memory banks, thereby reducing an area of a chip corresponding to the semiconductor device.

A semiconductor device according to one embodiment of the present invention includes memory banks, a boost voltage generating controller, and boost voltage pumps. The boost voltage generating controller outputs boost voltage enable signals corresponding to the number of activated memory banks of the memory banks, wherein the number of the boost voltage enable signals is less than that of the memory banks. The boost voltage pumps generate a boost voltage in response to the boost voltage enable signal, and provide the boost voltage to the activated memory bank. Here, the number of the boost voltage pumps is less than that of the memory banks.

The boost voltage generating controller includes a first counter configured to generate, one by one, an active pulse when the memory banks are activated; a second counter configured to generate, one by one, a precharge pulse when the memory banks are precharged; a first pulse shifter configured to output active control signals in response to the generated active pulse; a second pulse shifter configured to output precharge control signals in response to the generated precharge pulse; and a boost voltage pump driving signal generator configured to output boost voltage pump enable signals in accordance with the active control signal and the precharge control signal, thereby driving the boost voltage pumps.

At least one of the first and second counters includes a plurality of first NAND gates configured to perform NAND operation about selecting signals or precharge signals; a plurality of NOR gates configured to perform NOR operation about outputs of the NAND gates; and a second NAND gate configured to output the active pulse or the precharge pulse by performing NAND operation about outputs of the NOR gates.

One or more of the first and second pulse shifters includes a plurality of shifters configured to output the active control signal or the precharge control signal in accordance with the active pulse or the precharge pulse outputted form the counters, and output the boost voltage pump enable signal to next shifter; and an inverter configured to initialize a corresponding shifter in accordance with a power up signal so that one of the shifters is enabled.

Each of the shifters includes a first transmission gate turned on in response to the active pulse or the precharge pulse outputted from the counter, thereby transmitting an output of a corresponding shifter; a latch circuit configured to latch the output transmitted from the first transmission gate; a first inverter configured to invert an output of the latch circuit; a second transmission gate turned on in accordance with the active pulse or the precharge pulse outputted from the counter, thereby transmitting an output of the first inverter; a logic operating circuit configured to perform logic operation about the output transmitted from the second transmission gate and the power up signal pwrup; a second inverter configured to initialize the logic operating circuit in response to the power up signal; a third inverter configured to invert an output of the logic operating circuit, and transmit the inverted output to next shifter; and a pulse generating circuit configured to output the active control signal or the precharge control signal having low state in accordance with an output of the third inverter.

The logic operating circuit is a NOR gate or a NAND gate.

The pulse generating circuit includes an invert delaying circuit configured to invert the output of the third inverter, and delay the inverted output for a certain time; and a NAND gate configured to perform NAND operation about the output of the third inverter and the output of the invert delaying circuit.

The shifters are enabled in sequence whenever the active pulse or the precharge pulse is inputted, and output in sequence the active control signals or the precharge control signals.

The boost voltage pump driving signal generating circuit includes a plurality of boost voltage pump driving signal generators for outputting the boost voltage pump enable signal to the boost voltage pump in accordance with the active control signal and the precharge control signal.

A semiconductor device according to another embodiment of the present invention includes memory banks, boost voltage pumps and boost voltage generating controller. The boost voltage pumps provide a boost voltage to the memory banks. The boost voltage generating controller controls a driving of the boost voltage pump. Here, the number of the boost voltage pumps is smaller than that of the memory banks.

As described above, a semiconductor apparatus of the present invention includes boost voltage pumps as many as memory banks activated, and thus the number of the boost voltage pumps used wastefully is reduced. Additionally, an area which the boost voltage pumps occupy in a memory may be decreased.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 2:
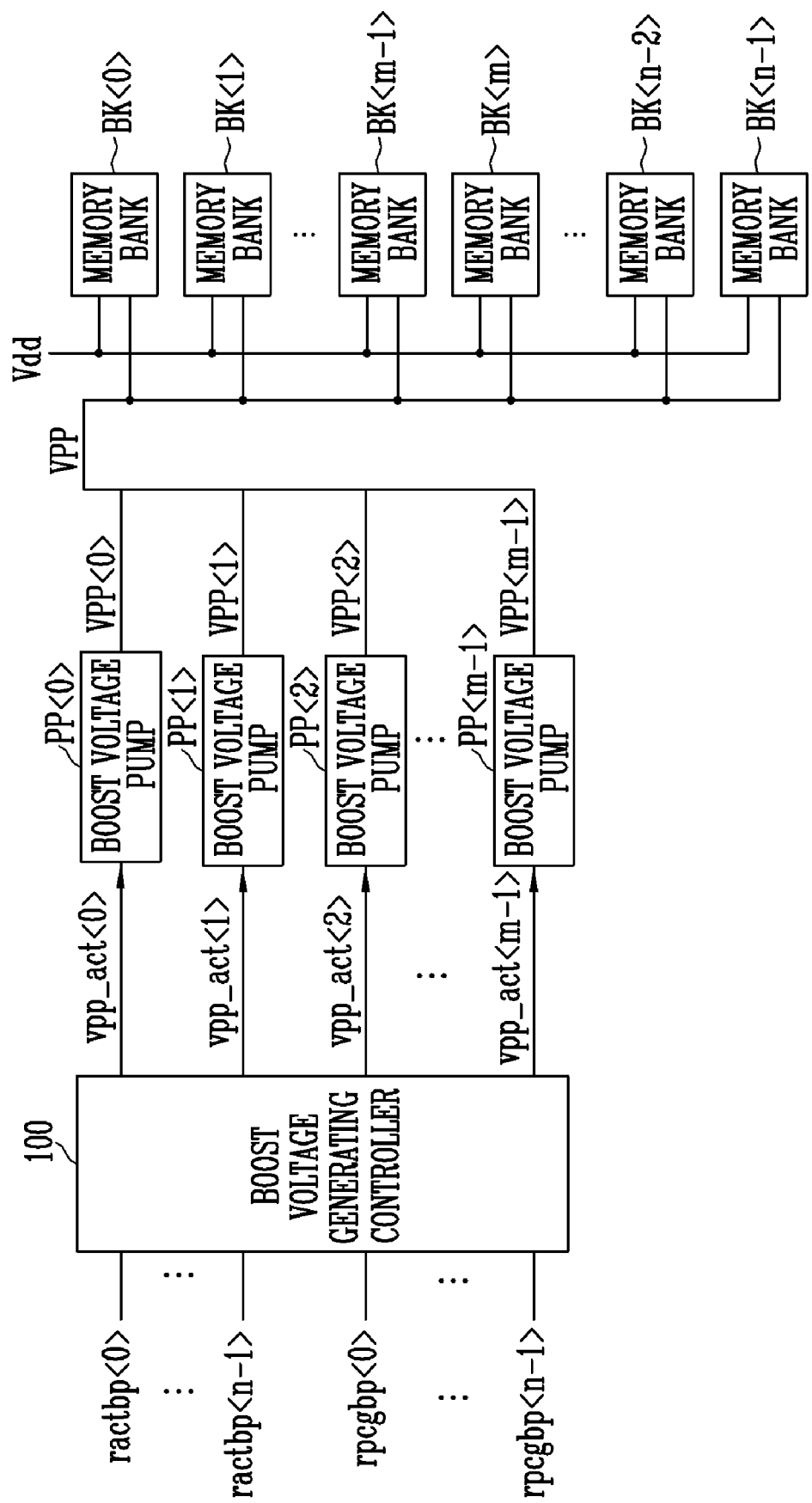
FIG. 2 is a block diagram illustrating a semiconductor device according to one embodiment of the present invention.

FIG. 2 is a block diagram illustrating a semiconductor device according to one embodiment of the present invention. Here, a DRAM includes n (which is an integer) memory banks, and a number of memory banks activated of n memory banks is limited to m (which is an integer, and is smaller than n) for convenience of description. In addition, for the purpose of understanding, it is considered that amount of a first boost voltage needed for one memory bank is substantially identical to that of a second boost voltage generated from one boost voltage pump.

As shown in FIG. 2, a boost voltage generating controller 100 outputs boost voltage pump enable signals Vpp_act<0> to Vpp_act<m−1> for driving boost voltage pumps needed for n memory banks to be activated in accordance with selecting signals ractbp<0> to ractbp<n−1> and precharge command signals rpcgbp<0> to rpcgbp<n−1>.

Here, a number of activated memory banks is detected through the selecting signals ractbp<0> to ractbp<n−1> and the precharge command signals rpcgbp<0> to rpcgbp<n−1>, and the boost voltage pump enable signals Vpp_act<0> to Vpp_act<m−1> are outputted in sequence from the first boost voltage pump enable signal Vpp_act<0> in response to the number of the activated memory banks. For example, in case that the number of the activated memory banks is three, the boost voltage generating controller 100 outputs only the first boost voltage pump enable signal Vpp_act<0>, the second boost voltage pump enable signal Vpp_act<1>, and the third boost voltage pump enable signal Vpp_act<0>.

m boost voltage pumps PP<0> to PP<m−1> output boost voltage power supplies VPP<0> to VPP<m−1> to corresponding memory banks through a common line in accordance with the boost voltage pump enable signals Vpp_act<0> to Vpp_act<m−1> outputted from the boost voltage generating controller 100. Here, the boost voltage pumps PP<0> to PP<m−1> are determined on the basis of amount of a boost voltage Vpp used in an auto refresh where the memory banks are simultaneously activated. This is because a maximum of the boost voltage is consumed in the auto refresh.

In brief, a semiconductor device such as a DRAM in Related Art includes n boost voltage pumps in accordance with n memory banks. However, the semiconductor device of the present embodiment includes m (maximum number of the memory banks to be activated) boost voltage pumps, and generates the boost voltage pump enable signals Vpp_act<0> to Vpp_act<m−1> as many as the memory banks activated. As a result, the semiconductor device may have only m boost voltage pumps, wherein m is smaller than n which is total number of the memory banks. That is, the number of the boost voltage pumps may be reduced compared to that in Related Art.

Figure 3:
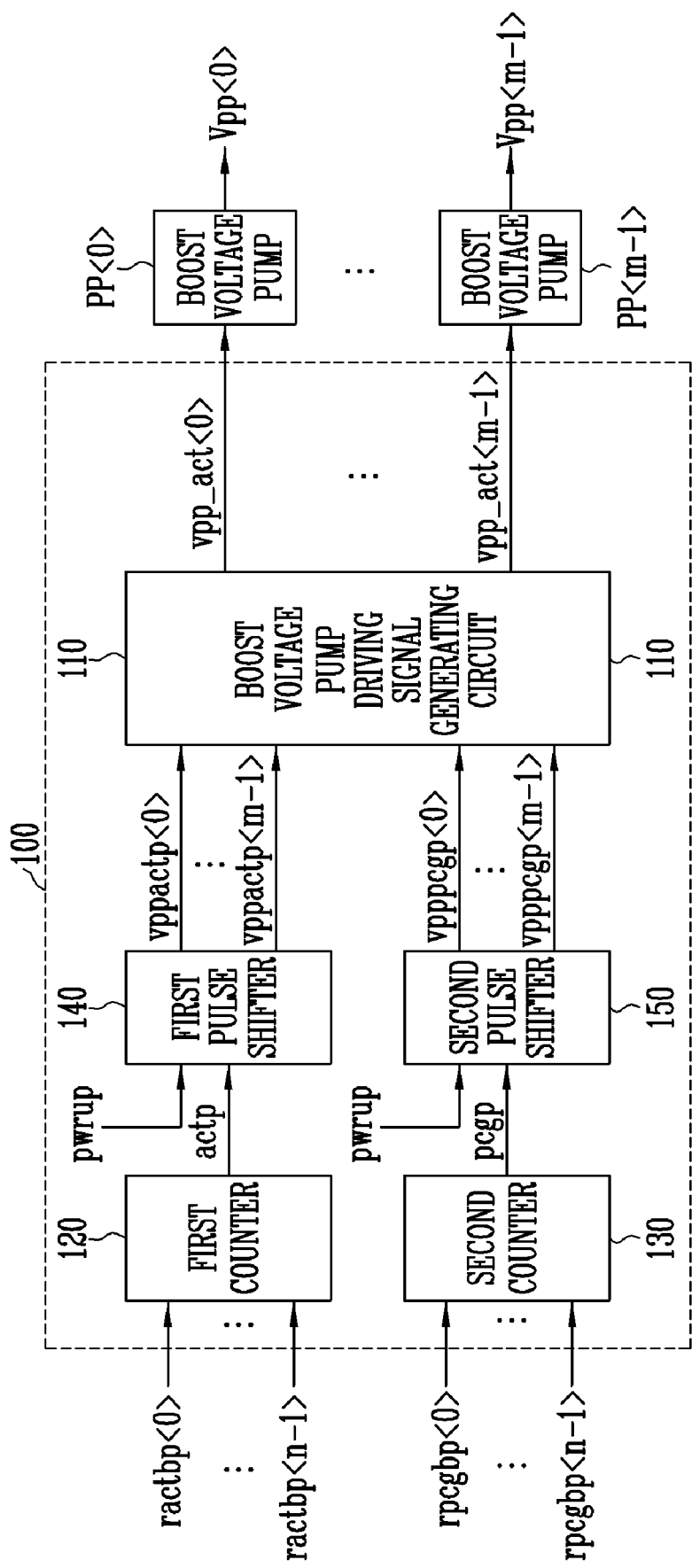
FIG. 3 is a block diagram illustrating the boost voltage generating controller in FIG. 2.

FIG. 3 is a block diagram illustrating the boost voltage generating controller in FIG. 2.

In FIG. 3, the boost voltage generating controller 100 includes first and second counters 120 and 130, first and second pulse shifters 140 and 150, and a boost voltage pump driving signal generating circuit 110.

The first counter 120 generates, one by one, an active pulse actp having high pulse whenever at least one of the selecting signals ractbp<0> to ractbp<n−1> has low pulse in accordance with the activation of the memory banks.

The second counter 130 generates, one by one, a precharge pulse pcgp having high pulse whenever the precharge command signals rpcgbp<0> to rpcgbp<n−1> have low pulse.

The first pulse shifter 140 is initialized by using a power up signal pwrup, and then outputs, in sequence, active control signals vppactp<0> to vppactp<m−1> having low pulse from the first active control signal vppactp<0> whenever the active pulse actp generated from the first counter 120 is high.

In addition, the second pulse shifter 150 is initialized in accordance with the power up signal pwrup, and then outputs, in sequence, prcharge control signals vpppcgp<0> to vpppcgp<m−1> having low pulse from the first precharge control signal vpppcgp<0> whenever the precharge pulse pcgp generated from the second counter 130 is high.

The boost voltage pump driving signal generating circuit 110 outputs, in sequence, the boost voltage pump enable signals Vpp_act<0> to Vpp_act<m−1> for driving the boost voltage pumps PP<0> to PP<m−1> from the first boost voltage pump enable signal Vpp_act<0> in accordance with the active control signals vppactp<0> to vppactp<m−1> and the prcharge control signals vpppcgp<0> to vpppcgp<m−1> outputted from the pulse shifters 140 and 150.

For example, the boost voltage pump driving signal generating circuit 110 outputs the first boost voltage pump enable signal Vpp_act<0> in accordance with the first active control signal vppactp<0> outputted from the first pulse shifter 140 and the first precharge control signal vpppcgp<0> outputted from the second pulse shifter 150. Additionally, the boost voltage pump driving signal generating circuit 110 outputs the second boost voltage pump enable signal Vpp_act<1> in accordance with the second active control signal vppactp<1> outputted from the first pulse shifter 140 and the second precharge control signal vpppcgp<1> outputted from the second pulse shifter 150.

In short, the boost voltage pump enable signals Vpp_act<0> to Vpp_act<m−1> outputted from the boost voltage pump driving signal generating circuit 110 drive in sequence the boost voltage pumps PP<0> to PP<m−>.

Figure 4:
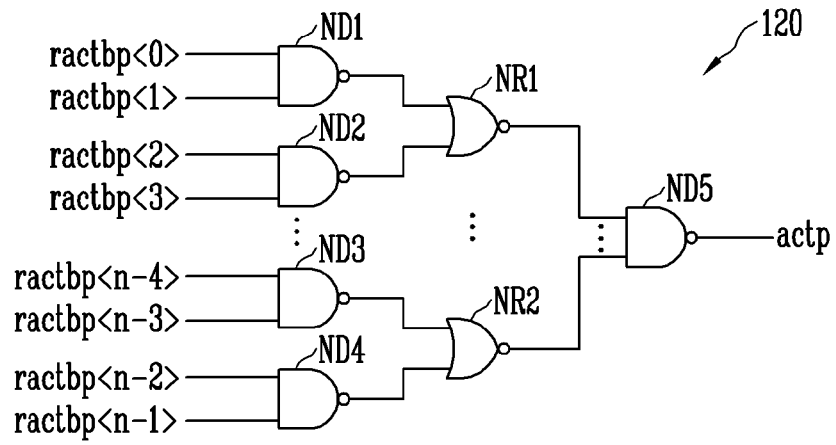
FIG. 4 is a view illustrating a circuitry of the first counter in FIG. 3.

In one embodiment of the present invention, each of the first and second counters 120 and 130 includes NAND gates ND1 to ND5, and NOR gates NR1 and NR2 as shown in FIG. 4.

FIG. 4 is a view illustrating a circuitry of the first counter in FIG. 3. Here, the second counter 130 has the same constitution and operation as in the first counter 120. However, input/output signals of the second counter 130 are different from those of the first counter 120.

Referring to FIG. 4, the first NAND gates ND1 to ND4 in the first counter 120 perform NAND operations about the selecting signals ractbp<0> to ractbp<n−1>, and output the NAND operation result values.

The NOR gates NR1 and NR2 operate NOR operations about the NAND operation result values, and output the NOR operation result values.

The second NAND gate ND5 performs NAND operation about the NOR operation result values, thereby outputting the active pulse actp.

Accordingly, the second NAND gate ND5 included in the first counter 120 outputs the active pulse actp having high pulse in case that at least one of the selecting signal ractbp<0> to ractbp<n−1> is inputted with low pulse.

A second NAND gate ND5 included in the second counter 130 having the same constitution and operation as in the first counter 120 outputs a precharge pulse pcgp having high pulse in case that one or more of the precharge control signals vpppcgp<0> to vpppcgp<m−1> is inputted with low pulse.

Figure 5:
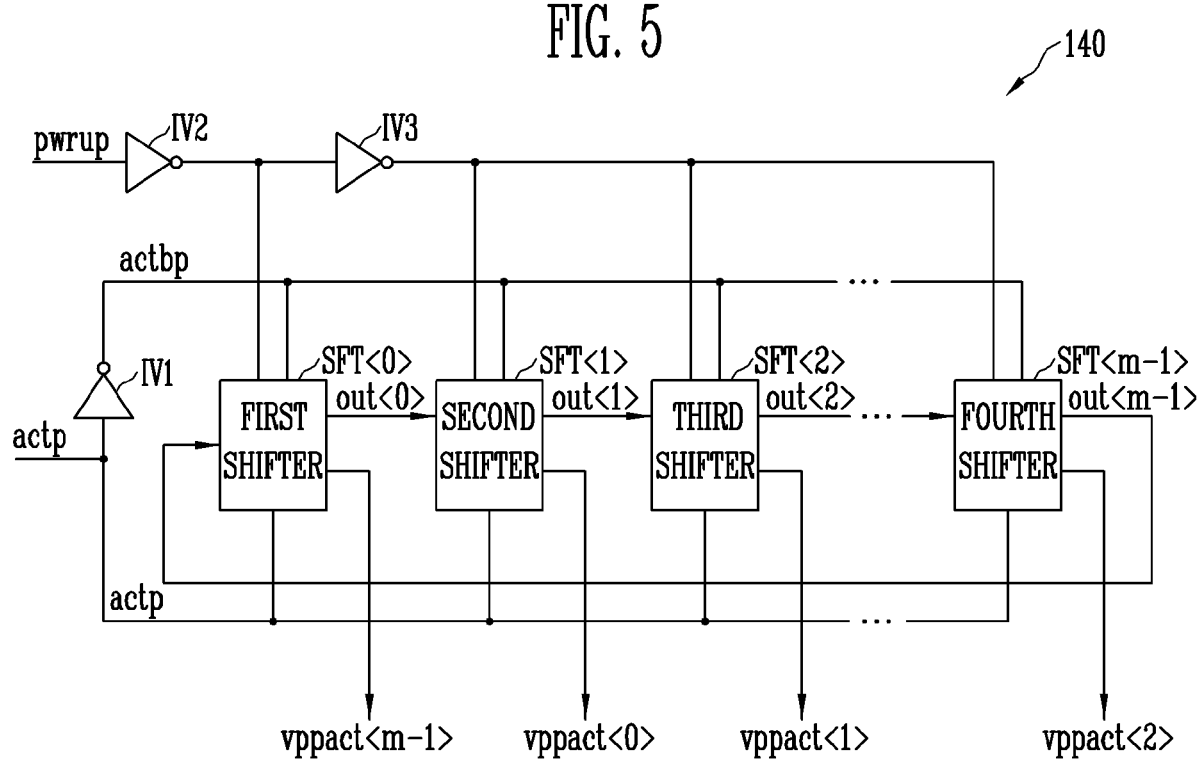
FIG. 5 is a block diagram illustrating a circuitry of the first pulse shifter in FIG. 2.

In one embodiment of the present invention, at least one of the first and second pulse shifters 140 and 150 includes a plurality of shifters SFT<0> to SFT<m−1>, and a plurality of inverters IV1 to IV3 as shown in FIG. 5.

FIG. 5 is a block diagram illustrating a circuitry of the first pulse shifter in FIG. 2. Here, the second pulse shifter 150 has the same constitution and operation as in the first pulse shifter 140. However, input/output signals of the second pulse shifter 150 are different from those of the first pulse shifter 140.

In FIG. 5, the second and third inverters IV2 and IV3 invert and re-invert the power up signal pwrup, provide the inverted signal to one of the first to fourth shifters SFT<0> to SFT<m−1> so that the provided shifter is enabled, and provide the re-inverted signal to the other shifters so that the other shifters are disabled. That is, the shifters SFT<0> to SFT<m−1> are initialized.

Then, the shifters SFT<0> to SFT<m−1> output in sequence active control signals vppactp having low pulse in accordance with the active pulse actp outputted from the first counter 120 and an active pulse actbp inverted by the first inverter IV1. Further, each of the shifters SFT<0> to SFT<m−1> is enabled or disabled in response to an output of a previous shifter.

Figure 6A:
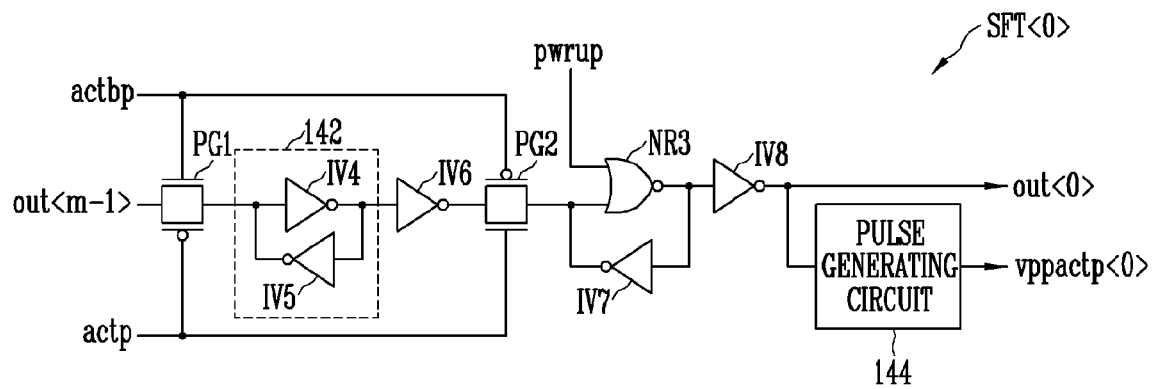
FIG. 6A is a view illustrating a circuitry of the first shifter in FIG. 5.
Figure 6B:
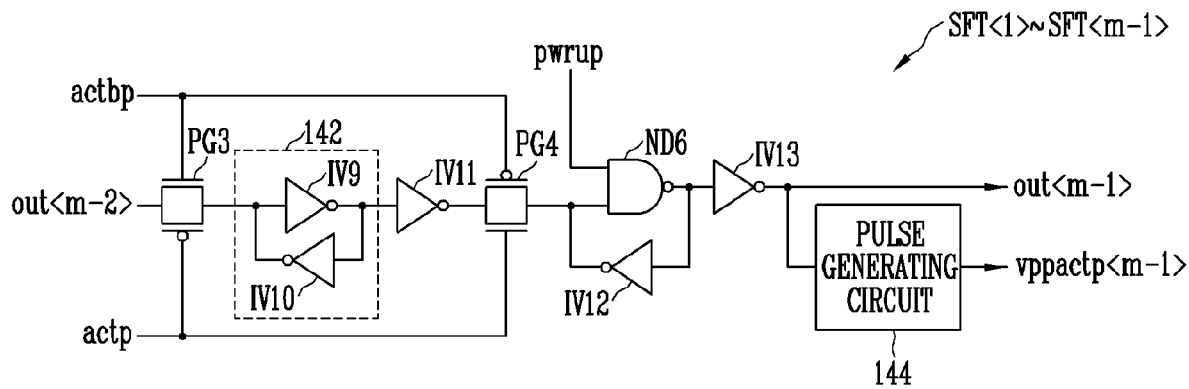
FIG. 6B is a view illustrating circuitries of the second to fourth shifters in FIG. 5.

Each of the shifters SFT<0> to SFT<m−1> includes transmission gates PG1 and PG2, inverters IV6 and IV8, a latch circuit 142, an NOR gate NR3 or an NAND gate ND6, and a pulse generating circuit 144 as shown in FIG. 6A or FIG. 6B.

FIG. 6A is a view illustrating a circuitry of the first shifter in FIG. 5. FIG. 6B is a view illustrating circuitries of the second to fourth shifters in FIG. 5. Here, the second to fourth shifters SFT<1> to SFT<m−1> have the same constitution and operation as in the first shifter SFT<0>. However, the second to fourth shifters SFT<1> to SFT<m−1> includes an NAND gate ND6 unlike the first shifter SFT<0> having the NOR gate NR3.

Referring to FIG. 6A, the NOR gate NR3 is coupled to an inverter IV7, receives its output inverted by the inverter IV7, and is initialized in response to the power up signal pwrup.

The first transmission gate PG1 is turned on in response to the active pulse actp and an active pulse inverting signal actbp through the inverter IV1 in case that the active pulse actp is provided from the first counter 120.

An output out<m−1> of previous shifter SFT<m−1> is transmitted to the latch circuit 142 through the first transmission gate PG1, and then is latched.

An output of the latch circuit 142 is inverted by an inverter IV6, and is inputted to one input terminal of the NOR gate NR3 via a second transmission gate PG2 turned on in response to the active pulse actp and the active pulse inverting signal actbp.

The NOR gate NR3 performs a NOR operation about an output of the second transmission gate PG2 and the power up signal pwrsup having high level. In this case an output of the NOR gate NR3 is inverted by an inverter IV8, and then the inverted output is outputted.

The output of the inverter IV8 is inputted to the pulse generating circuit 144, and so the active control signal vppactp is outputted from the pulse generating circuit 144. In addition, the output of the inverter IV8 is provided to next shifter SFT<2> so that the shifter SFT<2> is enabled or disabled.

Figure 7:
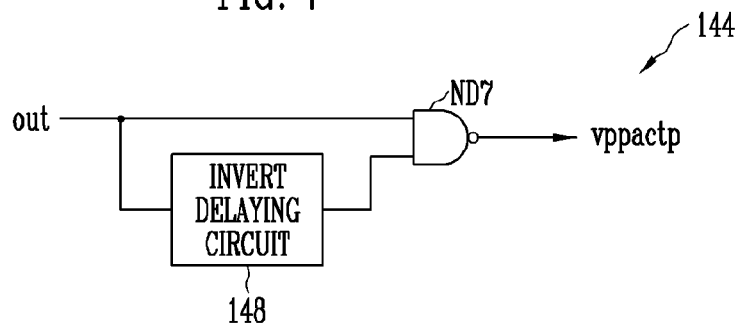
FIG. 7 is a view illustrating a circuitry of the pulse generating circuit in FIG. 6A or FIG. 6B.

In one embodiment of the present invention, the pulse generating circuit 144 includes an invert delaying circuit 148 and a NAND gate ND6 as shown in FIG. 7.

FIG. 7 is a view illustrating a circuitry of the pulse generating circuit in FIG. 6A or FIG. 6B.

Referring to FIG. 7, the invert delaying circuit 148 inverts the output of the inverter IV8, delays the inverted output, and outputs the delay output.

The NAND gate ND7 performs a NAND operation about the output of the inverter IV8 and the output of the invert delaying circuit 148, thereby outputting the active control signal vppactp. Accordingly, the pulse generating circuit 144 outputs the active control signal vppactp delayed as much as time preset to the invert delaying circuit 148.

Hereinafter, an operation of the first pulse shifter 140 will be described in detail with reference to FIG. 5 to FIG. 7.

Firstly, in case that the power up signal pwrup has low state, the NOR gate NR3 and the NAND gate ND6 as shown in FIGS. 6A and 6B are initialized. In this case, the power up signal pwrup maintains low state when power is turned on, and is converted into high state in case that the power is stabilized.

Hence, in case that the power up signal pwrup has low state, the power up signal pwrup is inverted into high state by the first inverter IV2, and then the inverted signal having high state is provided to the first shifter SFT<0>. In addition, the power up signal pwrup inverted by the first inverter IV2 is inverted again by the second inverter IV3, and then the inverted signal having low state is transmitted to the second to fourth shifters SFT<1> to SFT<m−1>.

As a result, the signal having high state is provided to one input terminal of the NOR gate NR3 of the first shifter SFT<0>, and so the output of the NOR gate NR3 is initialized to low state. Accordingly, the output of the inverter IV8 has high state.

Additionally, the signal having low state is inputted to one input terminal of the NAND gate ND6 included in the second to fourth shifters SFT<1> to SFT<m−1>, and so the output of the NAND gate ND6 is initialized to high state. Accordingly, an output of an inverter IV13 has low state.

In case that the above initializing process is finished, the power up signal pwrup maintains high level, and then the transmission gates PG1 and PG3 are turned on in accordance with the active pulse actp outputted from the first counter 120. As a result, the output of previous shifter is inputted.

In the first shifter SFT<0>, a signal having low state outputted from the fourth shifter SFT<m−1> is latched to a signal having high state through the first transmission gate PG1. As a result, the first shifter SFT<0> is disabled. Here, the fourth shifter SFT<m−1> is located at a previous terminal of the first shifter SFT<0>.

In addition, in the second shifter SFT<1>, a signal having high state outputted from the first shifter SFT<0> is latched to a signal having low state through the transmission gate PG3. As a result, the second shifter SFT<1> is enabled. Here, the first shifter SFT<0> is located at a previous terminal of the second shifter SFT<1>.

In the third and fourth shifters SFT<2> to SFT<m−1> like the second shifter SFT<1>, a signal having low state outputted from a previous shifter is latched to a signal having high state through the transmission gate PG3. As a result, the third and fourth shifters SFT<2> to SFT<m−1> are disabled.

Additionally, the second transmission gates PG2 and PG4 are turned on in accordance with the active pulse actp, the signal having high state latched to the latch circuit 142 is converted into a signal having low state by the inverter IV6. Then, the signal having low state is transmitted to an input terminal of the NOR gate NR3 through the second transmission gate PG2, and so a signal having high state is outputted from the NOR gate NR3. Subsequently, the signal having high state is converted into a signal having low state by the inverter IV8, and then the signal having low state is outputted to the pulse generating circuit 144 and the second shifter SFT<1>.

Further, in the second shifter SFT<1>, the signal having low state latched to the latch circuit 142 is converted into a signal having high state by the inverter IV11. Then, the signal having high state is transmitted to an input terminal of the NAND gate ND6 through the second transmission gate PG4, and so a signal having low state is outputted from the NAND gate ND6.

Subsequently, the signal having low state is converted into a signal having high state by the inverter IV13, and then the signal having high state is outputted to the pulse generating circuit 144 and the third shifter SFT<2>.

In the third and fourth shifters SFT<2> to SFT<m−1>, a signal having low state is outputted to the pulse generating circuit 144 and next shifter SFT<3> to SFT<0>.

As a result, in the second shifter SFT<1>, the invert delaying circuit 148 outputs a signal having high state, and so the pulse generating circuit 144 outputs the active control signal vppactp<1> having low state as much as the time preset to the invert delaying circuit 148 in case that the second shifter SFT<1> receives the signal having high state.

Then, the active control signal vppactp<1> is converted into high state after the lapse of the time. In this case, the first, third and fourth shifters SFT<0>, SFT<2> to SFT<m−1> maintain high state for the time.

In the above operation, each of the first and second pulse shifters 140 and 150 receives the active pulse actp and the precharge pulse pcgp through the first and second counters 120 and 130, and enables in sequence the shifters SFT<0> to SFT<m−1> whenever the active pulse actp and the precharge pulse pcgp are inputted with high state, thereby outputting in sequence the active control signals vppactp<0> to vppactp<m−1> having low state and the precharge control signals vpppcgp<0> to vpppcgp<m−1>.

The boost voltage pump driving signal generating circuit 110 outputs in sequence the boost voltage pump enable signal Vpp_act in accordance with the active control signal vppactp and the precharge control signal vpppcgp.

Figure 8:
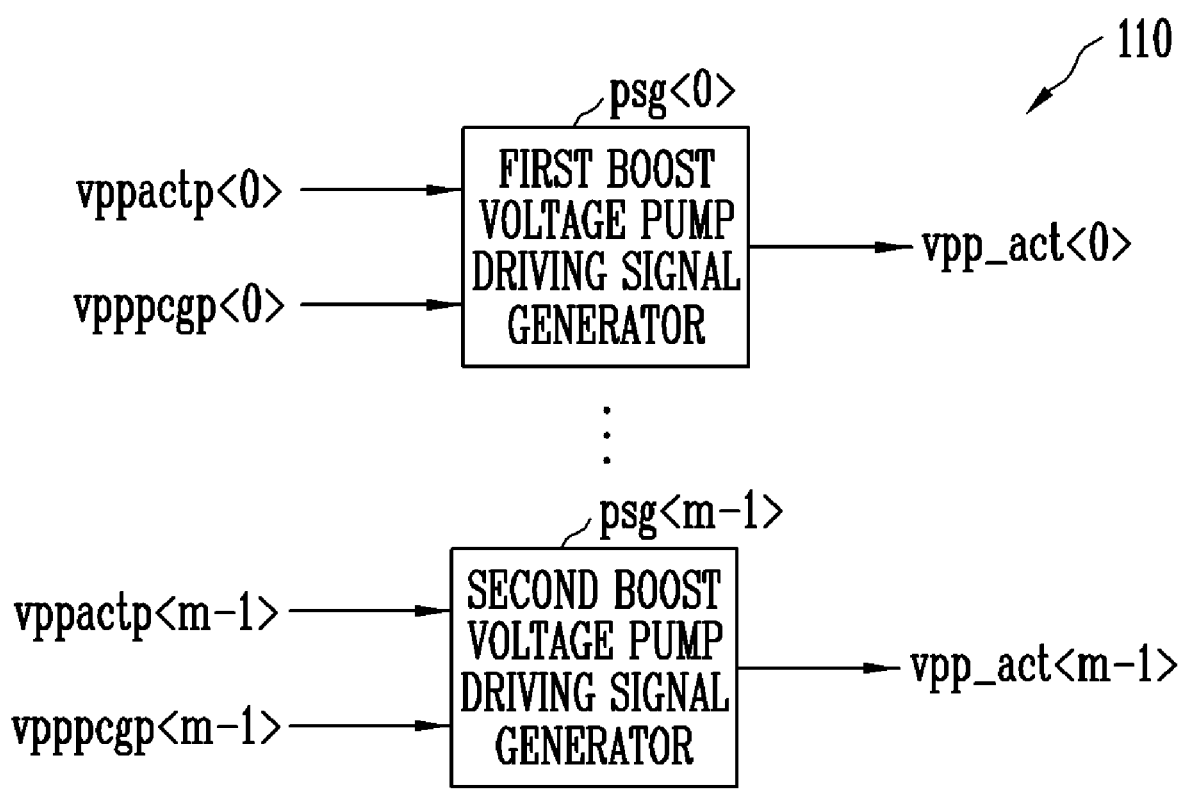
FIG. 8 is a block diagram illustrating a circuitry of the boost voltage pump driving signal generating circuit in FIG. 3.

FIG. 8 is a block diagram illustrating a circuitry of the boost voltage pump driving signal generating circuit in FIG. 3. Here, the boost voltage pump driving signal generating circuit includes a plurality of boost voltage pump driving signal generator psg<0> to psg<m−1>.

Referring to FIG. 8, the boost voltage pump driving signal generators psg<0> to psg<m−1> receive the active control signals vppactp outputted from the first pulse shifter 140 and the precharge control signals outputted from the second pulse shifter 150, and outputs in sequence the boost voltage pump enable signals Vpp_act to the boost voltage pumps PP in accordance with the received active control signals vppactp and the received precharge control signals. Here, the boost voltage pump enable signal Vpp_act is firstly outputted to the boost voltage pump PP<0>.

In addition, the boost voltage pump driving signal generator psg<0> to psg<m−1> have the same constitution as the control circuit of the boost voltage generator mentioned in Related Art. Hence, any further description about the boost voltage pump driving signal generator will be omitted.

The first boost voltage pump driving signal generator psg<0> of the boost voltage pump driving signal generating circuit 110 receives the active control signal vppactp<0> outputted from the first pulse shifter 140 and the precharge control signal vpppcgp<0> outputted from the second pulse shifter 150, and outputs the boost voltage pump enable signal Vpp_act<0> in accordance with the received active control signal vppactp<0> and the received precharge control signal vpppcgp<0>, thereby driving the boost voltage pump PP<0>.

The second boost voltage pump driving signal generator psg<1> receives the active control signal vppactp<1> outputted from the first pulse shifter 140 and the precharge control signal vpppcgp<1> outputted from the second pulse shifter 150, and outputs the boost voltage pump enable signal Vpp_act<1> in accordance with the received active control signal vppactp<1> and the received precharge control signal vpppcgp<1>, thereby driving the boost voltage pump PP<1>.

The boost voltage pump PP<1> is driven up to the boost voltage pump PP<m−1> through the above method, and so positive boost voltage Vpp needed for activated memory banks is generated.

In brief, in Related Art, n boost voltage pumps are required in case that the number of the memory banks included in the DRAM is n. However, in the boost voltage generating controller according to the present invention, though the number of the memory banks is n, the boost voltage Vpp may be stably maintained in the DRAM by using only m (is smaller than n) boost voltage pumps. That is, the number of the boost voltage pumps may be reduced, and so an area which the boost voltage pumps occupy is reduced.

Hereinafter, an operation of the boost voltage pump controller according to another embodiment of the present invention will be described in detail with reference to accompanying drawing.

Figure 9:
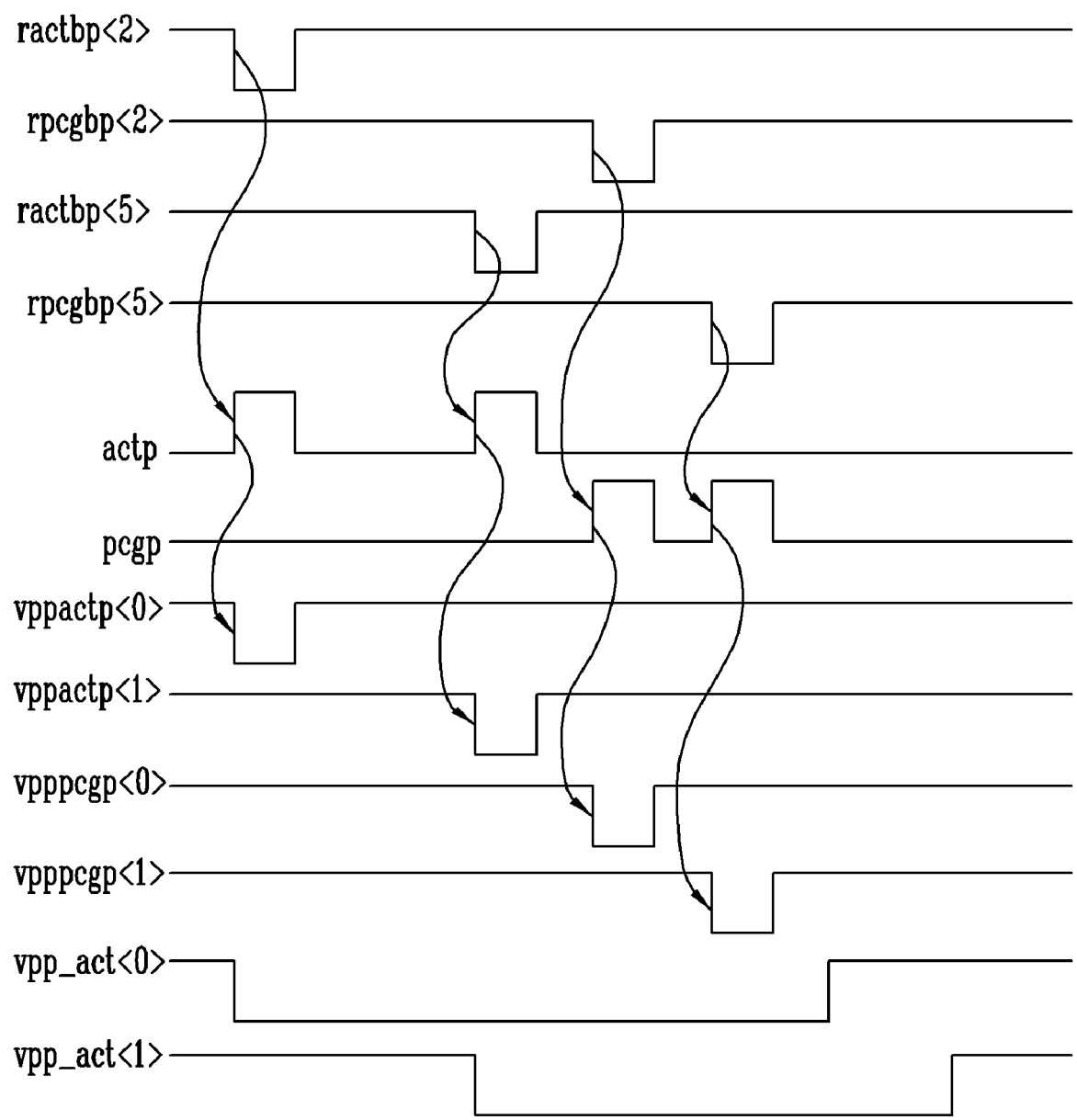
FIG. 9 is a timing diagram illustrating the boost voltage generating controller in FIG. 3.

FIG. 9 is a timing diagram illustrating the boost voltage generating controller in FIG. 3.

Referring to FIG. 9, the second memory bank and the fifth memory bank are activated in sequence, and so the first counter 120 outputs one by one the active pulse actp having high state whenever the selecting signals ractbp<2> and ractbp<5> have low state in sequence.

In addition, the second memory bank and the fifth memory bank are precharged in sequence, and so the second counter 130 outputs one by one the precharge pulse pcgp having high state whenever the precharge command signals rpcgbp<2> and rpcgbp<5> have low state in sequence.

Subsequently, the first pulse shifter 140 outputs the active control signal vppactp<0> having low state through the second shifter SFT<1> in response to the first active pulse actp, and outputs the active control signal vppactp<1> having low state through the third shifter SFT<2> in response to the second active pulse actp.

Additionally, the second pulse shifter 150 outputs the precharge control signal vpppcgp<0> having low state through the second shifter SFT<1> in response to the first precharge pulse pcgp, and outputs the precharge control signal vppactp<1> having low state through the third shifter SFT<2> in response to the second precharge pulse pcgp.

Then, the first boost voltage pump driving signal generator psg<0> in the boost voltage pump driving signal generating circuit 110 receives the active control signal vppactp<0> and the precharge control signal vpppcgp<0>. Further, the second boost voltage pump driving signal generator psg<1> receives the active control signal vppactp<1> and the precharge control signal vpppcgp<1>.

Subsequently, the first boost voltage pump driving signal generator psg<0> maintains the boost voltage pump enable signal Vpp_act<0> to low state when the active control signal vppactp<0> is activated, and converts the state of the boost voltage pump enable signal Vpp_act<0> into high state when the precharge control signal vpppcgp<0> is activated. Here, since the first boost voltage pump driving signal generator psg<0> includes the delaying circuit 70, the boost voltage pump enable signal Vpp_act<0> is not converted into high state without delay after the precharge control signal vpppcgp<0> is activated, but is converted into high state after delayed for a certain time from the activation of the precharge control signal vpppcgp<0>.

Further, the first boost voltage pump PP<0> drives during the boost voltage pump enable signal Vpp_act<0> outputted from the first boost voltage pump driving signal generator psg<0> has low state, and stops its driving when the boost voltage pump enable signal Vpp_act<0> is converted into high state.

The second boost voltage pump driving signal generator psg<1> maintains the boost voltage pump enable signal Vpp_act<1> to low state when the active control signal vppactp<1> is activated, and converts the state of the boost voltage pump enable signal Vpp_act<1> into high state when the precharge control signal vpppcgp<1> is activated. Here, since the second boost voltage pump driving signal generator psg<1> includes the delaying circuit 70, the boost voltage pump enable signal Vpp_act<1> is not converted into high state without delay after the precharge control signal vpp-pcgp<1> is activated, but is converted into high state after delayed for a certain time from the activation of the precharge control signal vpppcgp<1>.

Figure 1A:
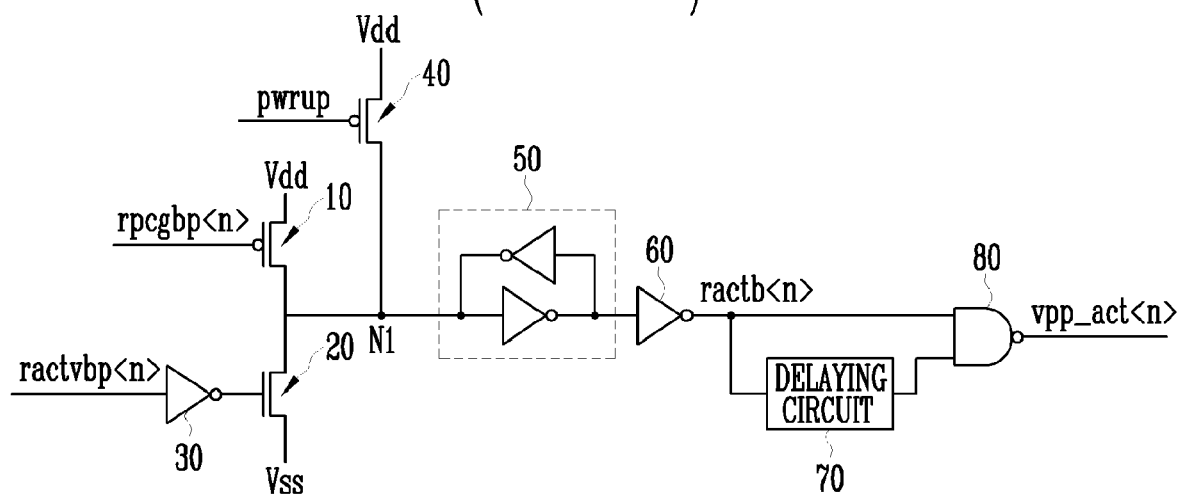
FIG. 1A is a view illustrating a control circuit of a common boosting voltage generator.
Figure 1B:
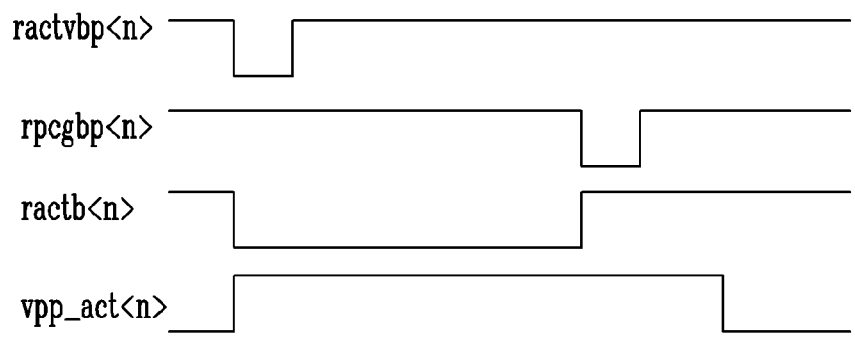
FIG. 1B is a timing diagram illustrating signals used in the control circuit in FIG. 1A.

Further, the second boost voltage pump PP<1> drives during the boost voltage pump enable signal Vpp_act<1> outputted from the second boost voltage pump driving signal generator psg<1> has low state, and stops its driving when the boost voltage pump enable signal Vpp_act<1> is converted into high state. Here, the boost voltage pump driving signal generators psg<0> to psg<m−1> output the boost voltage pump enable signals Vpp_act<0> to Vpp_act<m−1> delayed through the delaying circuit 70 shown in FIG. 1A. As a result, the boost voltage pumps PP<0> to PP<m−1> are driven for a given time after the activated memory bank is precharged, and so the boost voltage Vpp is stably generated.

The boost voltage pumps PP<0> to PP<m−1> boost the boost voltage power supplies VPP<0> to VPP<n−1> to corresponding memory bank activated and precharged in response to the boost voltage pump enable signal Vpp_act<0> to Vpp_act<m−1>.

When a particular feature, structure, or characteristic is described in connection with any embodiment, it is submitted that such feature, structure or characteristics is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a plurality of memory banks;
   a boost voltage generating controller configured to output boost voltage enable signals corresponding to the number of activated memory banks of the memory banks, wherein the boost voltage enable signals are generated by counting selecting signals and precharge command signals, and the number of the boost voltage enable signals is less than that of the memory banks; and
   a plurality of boost voltage pumps configured to generate a boost voltage in response to the boost voltage enable signals, and provide the boost voltage to the activated memory bank, wherein the number of the boost voltage pumps is less than that of the memory banks.

2. The semiconductor device of claim 1, wherein the boost voltage generating controller comprises:
   a first counter configured to generate, one by one, an active pulse when the memory banks are activated;
   a second counter configured to generate, one by one, a precharge pulse when the memory banks are precharged;
   a first pulse shifter configured to output active control signals in response to the generated active pulse;
   a second pulse shifter configured to output precharge control signals in response to the generated precharge pulse; and
   a boost voltage pump driving signal generator configured to output boost voltage pump enable signals in accordance with the active control signal and the precharge control signal, thereby driving the boost voltage pumps.

3. The semiconductor device of claim 2, wherein at least one of the first and second counters comprises:
   a plurality of first NAND gates configured to perform NAND operation about the selecting signals or the precharge command signals;
   a plurality of NOR gates configured to perform NOR operation about outputs of the NAND gates; and
   a second NAND gate configured to output the active pulse or the precharge pulse by performing NAND operation about outputs of the NOR gates.

4. The semiconductor device of claim 2, wherein one or more of the first and second pulse shifters comprises:
   a plurality of shifters configured to output the active control signal or the precharge control signal in accordance with the active pulse or the precharge pulse outputted form the counters, and output the boost voltage pump enable signal to next shifter; and
   an inverter configured to initialize a corresponding shifter in accordance with a power up signal so that one of the shifters is enabled.

5. The semiconductor device of claim 4, wherein each of the shifters comprises:
   a first transmission gate turned on in response to the active pulse or the precharge pulse outputted from the counter, thereby transmitting an output of a corresponding shifter;
   a latch circuit configured to latch the output transmitted from the first transmission gate;
   a first inverter configured to invert an output of the latch circuit;
   a second transmission gate turned on in accordance with the active pulse or the precharge pulse outputted from the counter, thereby transmitting an output of the first inverter;
   a logic operating circuit configured to perform logic operation about the output transmitted from the second transmission gate and the power up signal pwrup;
   a second inverter configured to initialize the logic operating circuit in response to the power up signal;
   a third inverter configured to invert an output of the logic operating circuit, and transmit the inverted output to next shifter; and
   a pulse generating circuit configured to output the active control signal or the precharge control signal having low state in accordance with an output of the third inverter.

6. The semiconductor device of claim 5, wherein the logic operating circuit is an NOR gate or NAND gate.

7. The semiconductor device of claim 5, wherein the pulse generating circuit comprises:
   an invert delaying circuit configured to invert the output of the third inverter, and delay the inverted output for a certain time; and
   a NAND gate configured to perform NAND operation about the output of the third inverter and the output of the invert delaying circuit.

8. The semiconductor device of claim 4, wherein the shifters are enabled in sequence whenever the active pulse or the precharge pulse is inputted, and output in sequence the active control signals or the precharge control signals.

9. The semiconductor device of claim 2, wherein the boost voltage pump driving signal generating circuit includes a plurality of boost voltage pump driving signal generators for outputting the boost voltage pump enable signal to the boost voltage pump in accordance with the active control signal and the precharge control signal.

10. A semiconductor device comprising:
a plurality of memory banks;
a plurality of boost voltage pumps configured to provide a boost voltage to the memory banks; and
a boost voltage generating controller configured to control a driving of the boost voltage pump,
wherein the number of the boost voltage pumps is smaller than that of the memory banks, and
wherein the boost voltage generating controller comprises:
a first counter configured to generate one by one an active pulse when the memory banks are activated;
a second counter configured to generate one by one a precharge pulse when the memory banks are precharged;
a first pulse shifter configured to output active control signals in response to the generated active pulse;
a second pulse shifter configured to output precharge control signals in response to the precharge pulse; and
a boost voltage pump driving signal generating circuit configured to output boost voltage pump enable signals in accordance with the active control signal and the precharge control signal, thereby driving the boost voltage pumps.

11. The semiconductor device of claim 10, wherein at least one of the first and second counters comprises:
a plurality of first NAND gates configured to perform NAND operation about selecting signals or precharge signals;
a plurality of NOR gates configured to perform NOR operation about outputs of the NAND gates; and
a second NAND gate configured to output the active pulse or the precharge pulse by performing NAND operation about outputs of the NOR gates.

12. The semiconductor device of claim 10, wherein one or more of the first and second pulse shifters comprises:
a plurality of shifters configured to output the active control signal or the precharge control signal in accordance with the active pulse or the precharge pulse outputted form the counters, and output the boost voltage pump enable signal to next shifter; and
an inverter configured to initialize a corresponding shifter in accordance with a power up signal so that one of the shifters is enabled.

13. The semiconductor device of claim 12, wherein each of the shifters comprises:
a first transmission gate turned on in response to the active pulse or the precharge pulse outputted from the counter, thereby transmitting an output of a corresponding shifter;
a latch circuit configured to latch the output transmitted from the first transmission gate;
a first inverter configured to invert an output of the latch circuit;
a second transmission gate turned on in accordance with the active pulse or the precharge pulse outputted from the counter, thereby transmitting an output of the first inverter;
a logic operating circuit configured to perform logic operation about the output transmitted from the second transmission gate and the power up signal pwrup;
a second inverter configured to initialize the logic operating circuit in response to the power up signal;
a third inverter configured to invert an output of the logic operating circuit, and transmit the inverted output to next shifter; and
a pulse generating circuit configured to output the active control signal or the precharge control signal having low state in accordance with an output of the third inverter.

14. The semiconductor device of claim 13, wherein the logic operating circuit is a NOR gate or a NAND gate.

15. The semiconductor device of claim 13, wherein the pulse generating circuit comprises:
an invert delaying circuit configured to invert the output of the third inverter, and delay the inverted output for a certain time; and
an NAND gate configured to perform NAND operation about the output of the third inverter and the output of the invert delaying circuit.

16. The semiconductor device of claim 12, wherein the shifters are enabled in sequence whenever the active pulse or the precharge pulse is inputted, and output in sequence the active control signals or the precharge control signals.

17. The semiconductor device of claim 10, wherein the boost voltage pump driving signal generating circuit includes a plurality of boost voltage pump driving signal generators for outputting the boost voltage pump enable signal to the boost voltage pump in accordance with the active control signal and the precharge control signal.

* * * * *